(12) United States Patent
Denton et al.

(10) Patent No.: US 6,891,124 B2
(45) Date of Patent: May 10, 2005

(54) METHOD OF WAFER BAND-EDGE MEASUREMENT USING TRANSMISSION SPECTROSCOPY AND A PROCESS FOR CONTROLLING THE TEMPERATURE UNIFORMITY OF A WAFER

(75) Inventors: Medona B. Denton, Tuscon, AZ (US); Wayne L. Johnson, Phoenix, AZ (US); Murray D. Sirkis, Tempe, AZ (US)

(73) Assignee: Tokyo Electron Limited, Tokyo (JP)

( * ) Notice: Subject to any disclaimer, the term of this patent is extended or adjusted under 35 U.S.C. 154(b) by 193 days.

(21) Appl. No.: 10/168,544

(22) PCT Filed: Jan. 5, 2001

(86) PCT No.: PCT/US01/00003
§ 371 (c)(1),
(2), (4) Date: Jul. 2, 2002

(87) PCT Pub. No.: WO01/50109
PCT Pub. Date: Jul. 12, 2001

(65) Prior Publication Data
US 2002/0189757 A1 Dec. 19, 2002

Related U.S. Application Data
(60) Provisional application No. 60/174,593, filed on Jan. 5, 2000, and provisional application No. 60/189,043, filed on Mar. 14, 2000.

(51) Int. Cl.[7] .............................................. B23K 10/00
(52) U.S. Cl. .................. 219/121.54; 219/502; 219/497; 156/345.27
(58) Field of Search ............................ 219/121.43, 502, 219/497, 121.44, 121.4; 392/416, 418; 118/724, 725; 204/298.2; 156/345.24, 345.27; 438/715

(56) References Cited

U.S. PATENT DOCUMENTS

| | | | |
|---|---|---|---|
| 5,255,286 A | 10/1993 | Moslehi et al. | |
| 5,270,222 A | 12/1993 | Moslehi | |
| 5,729,038 A | * 3/1998 | Young et al. | ................ 257/460 |
| 5,782,253 A | * 7/1998 | Cates et al. | ................. 134/105 |
| 6,062,729 A | 5/2000 | Ni et al. | |
| 6,082,892 A | * 7/2000 | Adel et al. | ................... 374/123 |
| 6,160,242 A | 12/2000 | Guardado | |

* cited by examiner

*Primary Examiner*—Mark Paschall
(74) *Attorney, Agent, or Firm*—Oblon, Spivak, McClelland, Maier & Neustadt, P.C.

(57) ABSTRACT

A method and system for using transmission spectroscopy to measure a temperature of a substrate (135). By passing light through a substrate, the temperature of the substrate can be determined using the band-edge characteristics of the wafer. This in-situ method and system can be used as a feedback control in combination with a variable temperature substrate holder (182) to more accurately control the processing conditions of the substrate. By utilizing a multiplicity of measurement sites the variation of the temperature across the substrate (135) can also be measured.

20 Claims, 10 Drawing Sheets

SCHEMATIC DIAGRAM OF A WAFER TEMPERATURE MEASUREMENT AND CONTROL APPARATUS COMPRISING A BROAD SPECTRUM LIGHT SOURCE, A WAVELENGTH SENSITIVE DETECTION SYSTEM, AN ACOUSTO-OPTICAL FILTER, A ONE-OR TWO-DIMENSIONAL CCD OR CID ARRAY, AND A LOCK-IN AMPLIFIER

SCHEMATICS OF TWO DIFFERENT CONFIGURATIONS FOR DIFFUSE
REFLECTANCE SPECTROSCOPY (DRS)

SCHEMATIC OF TRANSMISSION SPECTROSCOPY (TS)

FIG. 1c

SCHEMATIC OF SPECULAR REFLECTION SPECTROSCOPY (SRS)

SCHEMATIC DIAGRAM OF A SYSTEM FOR WAFER TEMPERATURE MEASUREMENT AND CONTROL

FIG. 5

SCHEMATIC DIAGRAM OF AN ALTERNATE EMBODIMENT OF A SYSTEM FOR WAFER TEMPERATURE MEASUREMENT AND CONTROL

FIG. 6

SCHEMATIC OF A WAFER TEMPERATURE MEASUREMENT AND CONTROL APPARATUS COMPRISING A BROAD SPECTRUM LIG SOURCE, A WAVELENGTH SENSITIVE DETECTION SYSTEM, AN ACOUSTO-OPTICAL FILTER, AND A LOCK-IN DETECTION SYSTEM.

FIG. 7

SCHEMATIC DIAGRAM OF A WAFER TEMPERATURE MEASUREMENT AND CONTROL APPARATUS COMPRISING A BROAD SPECTRUM LIGHT SOURCE, A WAVELENGTH SENSITIVE DETECTION SYSTEM, AN ACOUSTO-OPTICAL FILTER, A ONE- OR TWO-DIMENSIONAL CCD OR CID ARRAY, AND A LOCK-IN AMPLIFIER

FIG. 8

SIMULATION OF THE BAND-EDGE OF Si AT VARIOUS TEMPERATURES AS IF MEASURED USING TRANSMISSION SPECTROSCOPY (TS)

FIG. 9

DISTRIBUTION OF MEASUREMENT SITES ON TOP OF CHUCK

FIG. 10

METHOD OF WAFER BAND-EDGE MEASUREMENT USING TRANSMISSION SPECTROSCOPY AND A PROCESS FOR CONTROLLING THE TEMPERATURE UNIFORMITY OF A WAFER

CROSS-REFERENCE TO RELATED APPLICATIONS

The present application claims priority co-pending applications entitled "A Method of Substrate Band-Edge Measurement Using Transmission Spectroscopy and a Process for Tuning Temperature Uniformity," U.S. Provisional Ser. No. 60/174,593 filed Jan. 5, 2000; and "Multi-Zone Resistance Heater," U.S. Provisional Ser. No. 60/156,595 filed Sep. 29, 1999. All of those applications are herein incorporated by reference in their entirety.

FIELD OF THE INVENTION

The present invention is directed to an in-situ method of measuring the temperature of a substrate with a temperature dependent band-gap using band-edge thermometry (BET), and, more specifically, using transmission spectroscopy (TS).

DISCUSSION OF THE BACKGROUND

The accurate measurement of semiconductor substrate temperatures during processing is highly desirable for semiconductor substrate processing. In particular, most processes are temperature sensitive and therefore, accurate temperature measurement is a pre-requisite to the control of optimal conditions for etch and/or deposition chemistry. Moreover, a spatial variation of temperature across a semiconductor substrate can lead to non-uniform processing when either etching or depositing material.

Figure 1A:
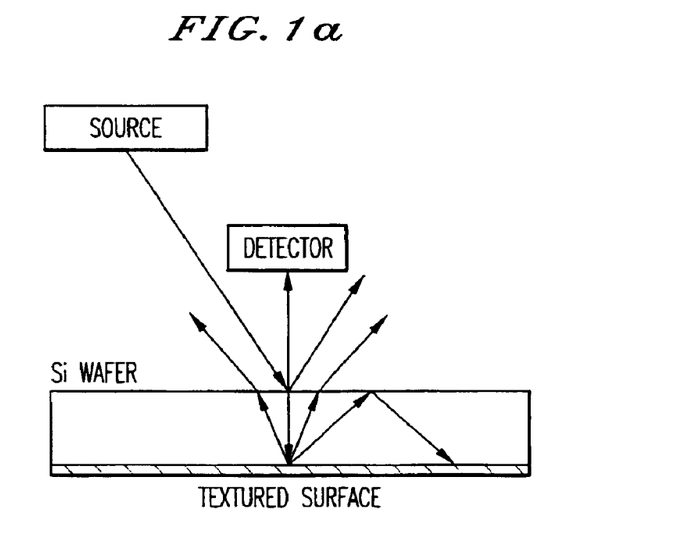
FIG. 1A is a schematic illustration of a first configuration of an apparatus using diffuse reflectance spectroscopy.
Figure 1B:
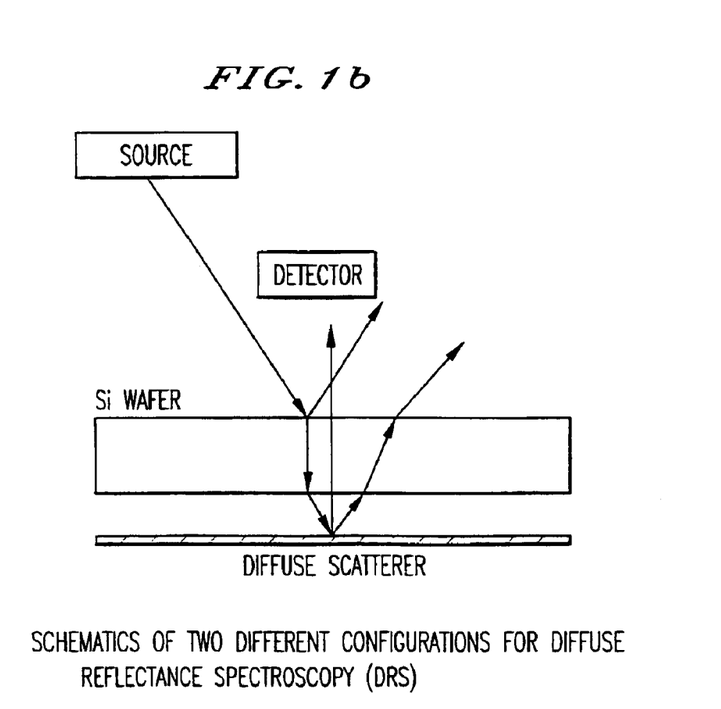
FIG. 1B is a schematic illustration of a second configuration of an apparatus using diffuse reflectance spectroscopy.

There are three geometric modes or configurations of band-edge thermometry (BET): (1) transmission spectroscopy (TS; see FIG. 1C), (2) specular reflection spectroscopy (SRS; see FIG. 1D), and (3) diffuse reflectance spectroscopy (DRS; see FIGS. 1A and 1B). The geometry of each mode is presented in FIGS. 1A–1D.

In the DRS mode, the light source and detector are on the same side of the substrate with the detector placed in a non-specular position (see Johnson et al., U.S. Pat. Nos. 5,568,978 and 5,388,909 (hereinafter "the '978 patent" and "the '909 patent," respectively)). A non-specular detector only sees the light that is transmitted through the wafer and that is diffusely back scattered into the solid angle of the detector. In the DRS method, the double-pass transmission of light through the substrate is measured as a function of wavelength or, equivalently, photon energy. As the wavelength increases, the photon energy decreases, and the onset of substrate transparency occurs as the photon energy becomes less than the band-gap energy.

In the SRS mode, the light source and detector are also on the same side of the substrate. The detector is placed in a specular position where it detects light that is specularly reflected from both surfaces of the wafer (see Cabib & Adel, U.S. Pat. No. 5,322,361 (hereinafter "the '361 patent)). The light that is reflected into the detector without traveling through the wafer contains no temperature information and consequently adds only a relatively constant background signal. The light component that is reflected from the opposite internal surface of the substrate travels back through the wafer and onto the detector. That reflected component, which passes twice though the wafer, contains the useful temperature information.

In the TS mode, the onset of substrate transparency (or, equivalently, the band-gap energy) is determined by the transmission of light through the substrate as described in Kirillov & Powell (U.S. Pat. No. 5,118,200 (hereinafter "the '200 patent")). In this geometry, the light source and the detection system are on opposite sides of the wafer. One difficulty with this approach is that it requires optical access to the chamber at opposite sides of the substrate. However, in comparison to the SRS mode, the TS mode results in an increase in the light intensity received by the optical detector.

No matter what mode is used, a temperature signature must be extracted from the spectra. In general, three algorithms have commonly been used to extract substrate temperature from band-edge spectra: (1) the spectral position of the maximum of the first derivative or, equivalently, the inflection point, (2) a direct comparison of the spectrum to a predetermined spectral database, and (3) the position of the spectrum knee (i.e., the location of the maximum of the second derivative). The first method has been discussed in the '200 patent. That method determined the substrate temperature as a function of the position of the inflection point of the spectrum in a previous calibration run where the temperature of each spectrum is known. The advantages of that method are that it is simple, fast and independent of the absolute intensity of measurement. The disadvantage is that it is very sensitive to interference effects that may occur at either surface of the processed silicon (Si) wafer.

In the second approach, the '361 patent compares a given spectrum to a temperature-dependent database composed of spectra taken at known temperatures. One advantage is that it is reported to work well for Si wafers. A disadvantage is that it is sensitive to interference effects and requires an absolute reflectivity measurement. Accordingly, each wafer may require a separate normalization spectrum.

Lastly, the '978 and '909 patents disclose a DRS mode BET, using the position of the spectrum knee as a signature. Its advantage is that it is the closest distinct point to the onset of transparency of a substrate, and is therefore less sensitive to interference effects. A shortcoming of this approach is that it requires sophisticated fitting algorithms that may be too slow for some current applications.

In general, a BET system includes three main units, i.e., a light source, a dispersion device and a photo-detector. Currently, there are several commercially available systems; however, none of these systems is fully capable of the following criteria:

1) Non-contact thermometry from the bare backside of Si wafers during front side processing.

2) Use of optical methods and quartz rods to couple light in and out of the process chamber.

3) Two-dimensional snapshot of wafer temperature.

4) Simultaneous samples of several points (approximately 10) on large Si wafers with a response time of 100 msec or less.

5) Temperature range of 20 to 300° C.

6) Accuracy of temperature measurement to within 2 to 5° C.

SUMMARY OF THE INVENTION

It is an object of the present invention to provide a non-intrusive method of measuring (1) substrate temperature and (2) spatial variation of the substrate temperature. This measuring process can, in turn, be employed to (1) tune the thermal response of a chamber to a process and (2)

concurrently modify temperature characteristics of the chamber in response to temperature measurements performed in-situ throughout that process.

Since the band-gap of most semiconductor materials decreases with temperature (linearly above the Debye temperature), the onset of transparency of semiconductor materials gives a precise reproducible measure of substrate temperature. This makes band-edge thermometry (BET) an ideal method for in-situ non-contact measurements of substrate temperature during semiconductor processing. This method is particularly useful for low temperature applications where pyrometry is not effective and in applications where the process has a detrimental effect on in-situ temperature sensors (e.g., thermocouples) or, conversely, where in-situ temperature sensors have a detrimental effect on the process.

BRIEF DESCRIPTION OF THE DRAWINGS

A more complete appreciation of the invention and many of the attendant advantages thereof will become readily apparent to those skilled in the art with reference to the following detailed description, particularly when considered in conjunction with the accompanying drawings, in which.

DETAILED DESCRIPTION OF THE PREFERRED EMBODIMENTS

Figure 1C:
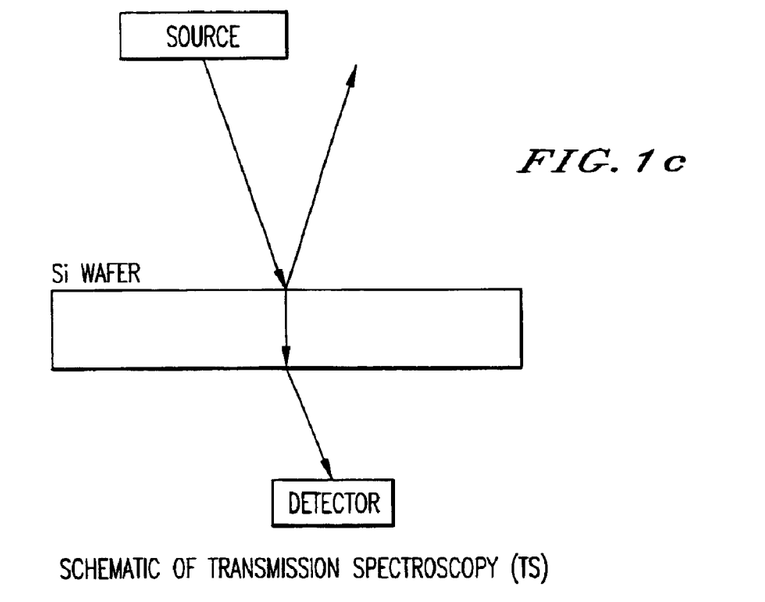
FIG. 1C is a schematic illustration of a first configuration of an apparatus using transmission spectroscopy.

Referring now to the drawings, wherein like reference numerals designate identical or corresponding parts throughout the several views, FIG. 1C is a schematic illustration of a first configuration using transmission spectroscopy. The following sections describe: (1) the fundamental principles behind the use of transmission spectroscopy (TS); (2) embodiments used for measuring temperature, including a description of the light source(s), a description of the optics, and a description of the detection system; (3) a method for extracting temperature information; (4) the measurement speed; (5) the spectral resolution of the measurement, and (6) the tuning of the thermal characteristics of a substrate.

Fundamental Principles

The basic theory described herein is based on simulations of the Si band-edge when the absorption cross-section is assumed to be constant over the operating temperature and spectral ranges. Furthermore, the absorption coefficient near the band-edge is assumed to be proportional to the joint density of states of an indirect band-gap material with parabolic bands. Finally, the simulated band-edge spectra for Si are based on the TS measurement configuration.

Assuming that absorption is proportional to the optical joint density of states and that the energy bands are parabolic, then the absorption coefficient is quadratic in energy (for energies above the band-gap (in indirect band-gap materials)). Under those assumptions, the absorption edge for Si is described by:

$$\alpha_g = 0, \text{ for } h\nu < E_g,$$

and $$\alpha_g A_g (h\nu - E_g)^2, \text{ for } h\nu \geq E_g,$$

where $$E_g = E_g(T) = E_g(0) - (aT^2)/(T+B)$$

is the band-gap energy of Si as a function of temperature (see Thurmond, 1975), T is temperature, hv is the photon energy, and $A_g$ is a constant. Semiconductors are typically never perfectly transparent below the band edge due to absorption caused by free carriers. This absorption is represented by the term:

$$\alpha_f = A_f T^2,$$

where $A_f$ is a constant. The total absorption is given by:

$$\alpha = \alpha_g + \alpha_f.$$

Finally, for the TS measurement configuration, the band-edge spectra are given by:

$$TS = ((1-R^2)e^{-\alpha d})/(1-R^2 e^{-2\alpha d}),$$

where R is the reflectivity at the wafer surface and d is the wafer thickness.

Figure 8:
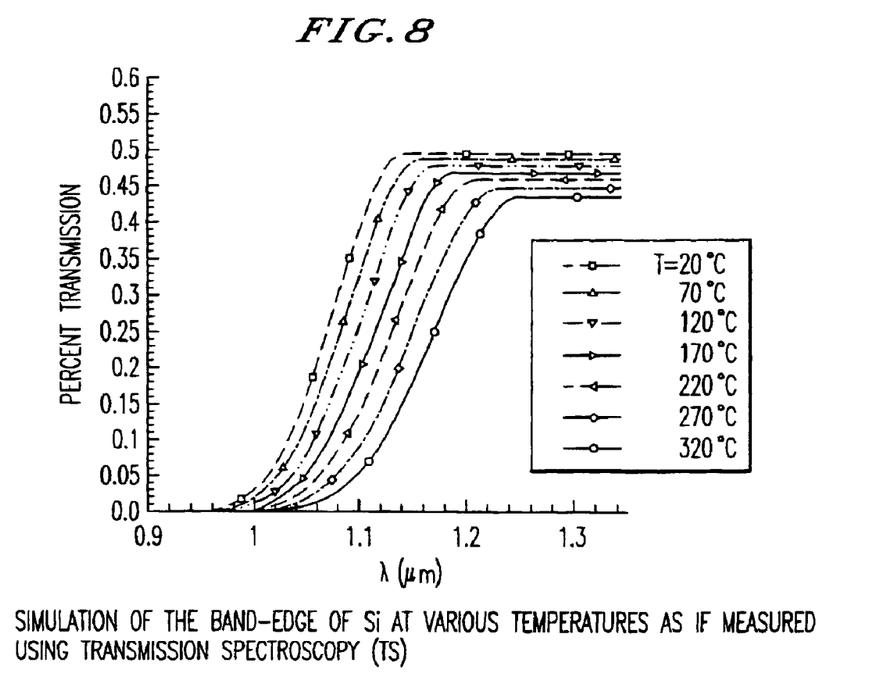
FIG. 8 is a graph showing the normalized transmission of IR radiation through a Si substrate as a function of wavelength with temperature as a parameter.

Band-edge spectra simulations using the above equation for TS are shown in FIG. 8 for a 40 mil silicon wafer. For the purpose of these simulations, the band-gap parameters used are $E_g(0)=1.12$ eV, a=0.000473 eV/K, and B=636 K (see Thurmond, 1975) and the other parameters used are $A_g=1,000$ cm$^{-1}$eV$^{-2}$, $A_f=0.000004$ cm$^{-1}$K$^{-2}$, and R=0.313. These parameters may vary depending on the type of doping and the doping level of the substrate. In addition, the total absorption or, equivalently, the total transmission depends upon the wafer thickness. Therefore, accuracy may be improved by providing a separate calibration curve for each doping type and level and for each wafer thickness. However, given a batch of wafers with uniform thickness and doping levels, this measurement technique will have a 1° C. reproducibility between wafers. The simulated spectra shown in FIG. 8 cover the temperature range from 20° C. to 320° C. The temperature of each spectrum is listed at the right-hand side of the plot, with the lowest temperature corresponding to the left-most spectrum. The temperature increases 50° C. per spectrum moving to the right where the right-most spectrum corresponds to 320° C. Those simulated spectra depict, as a function of wavelength and temperature, the fraction of incident radiation that passes through the substrate and emerges from the opposite side. The range of wavelengths is shown for which the transmission changes from essentially no transmission (approximately 0) to maximum transmission (approximately 0.45 to 0.50 depending on the temperature). When the photon energies are greater than the band-gap energy, the light is absorbed within the substrate, and when the energies are below the band-gap energy, the light is transmitted through the substrate. The transmitted light is analyzed by the spectrometer, and from a determination of the wavelength at which the onset of transparency occurs, the substrate temperature may be inferred.

The accuracy of the determination of substrate temperature can be improved through the use of additional information. Such additional information includes: (1) the extent of process chamber use since its most recent cleaning, (2) condition of the wafer surface, (3) wafer type (i.e., p-type or n-type and impurity concentration), (4) the characteristics of any surface coatings on the wafer, and (5) the size of the measurement elements in comparison to the wafer size and the sizes of any features on the wafer.

Figure 4:
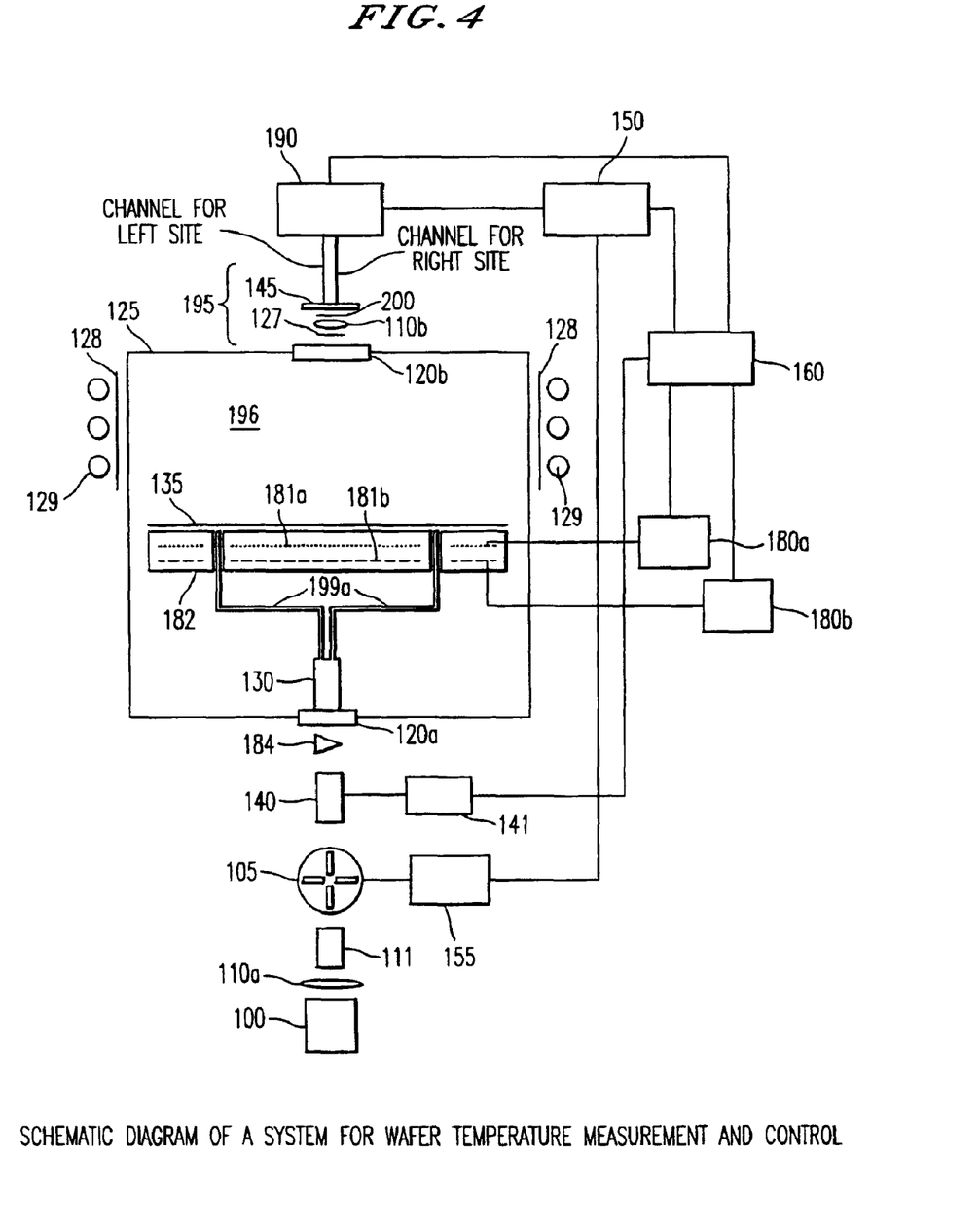
FIG. 4 is a schematic illustration of a first embodiment of a wafer temperature measurement system that uses feedback to control the temperature of a substrate.

A first embodiment of the present invention is shown in FIG. 4. It comprises a radiation source with an emission spectrum that includes at least the range of wavelengths of interest as shown in FIG. 8, and a wavelength sensitive detection system utilizing a spectrometer comprising an acousto-optic tunable filter (hereinafter AOTF), and, as shown in FIG. 4, a two-dimensional (hereinafter 2-D) photo-detector array (e.g., a 2-D charge-coupled-device (CCD) array or a 2-D charge-injection-device (CID) array). As would be appreciated by one of ordinary skill in the art, the band-gap energy can be determined as a function of temperature from FIG. 8.

A CID array has two distinct advantages relative to a CCD array for the purposes described herein.

Firstly, a CID array is not subject to "blooming," which may occur when a pixel is saturated and light intensity "spills" over into adjacent pixels. Secondly, pre-selected pixels within the pixel array may be sampled without scanning the entire pixel array. However, CCD arrays are typically faster and more sensitive than their CID counterparts. CID arrays may have a maximum pixel interrogation frequency of about 100 kHz (with zero gain). As the interrogation frequency decreases, the gain increases. For example, a gain of about 50 is attainable for an interrogation frequency of about 33 kHz. However, CCD arrays may be used at frequencies as high as about 100 kHz.

One advantage of the present invention is due to the use of an AOTF to replace mechanically rotated grating/single detector methods. In doing so, superior speed can be achieved over traditional methods while obtaining a 2-D representation of the temperature distribution across a substrate.

Furthermore, high speed extraction of temperature information from band-gap spectra is attainable using a method that utilizes digital filters based upon a higher-order derivative of the spectrum. The method presented herein can significantly reduce the time necessary for temperature extraction and minimize interference effects that are inherent to prior temperature extraction methods.

With these improvements, the BET measurement system is capable of highly resolved spectral measurements with short response times. In fact, response times less than 10 msec are possible. Such response times represent an improvement over past technology by a factor of one hundred. With the advent of this technology, improved spatial temperature control of semiconductor substrates will be possible.

A first embodiment of the system of the present invention is illustrated in FIG. 4. An optical system 195 views a substrate being processed through an infrared (IR) transmitting window 120b. In the illustrated embodiment the window is located in an upper surface of the process chamber in an ICP or ESRF plasma processor, but other locations are possible. The ICP and ESRF plasma processors include at least one induction coil 129, and an ESRF processor includes an electrostatic shield 128 as well. Ideally the axis of the optical system coincides with the axis of either the substrate or the wafer chuck.

Figure 9:
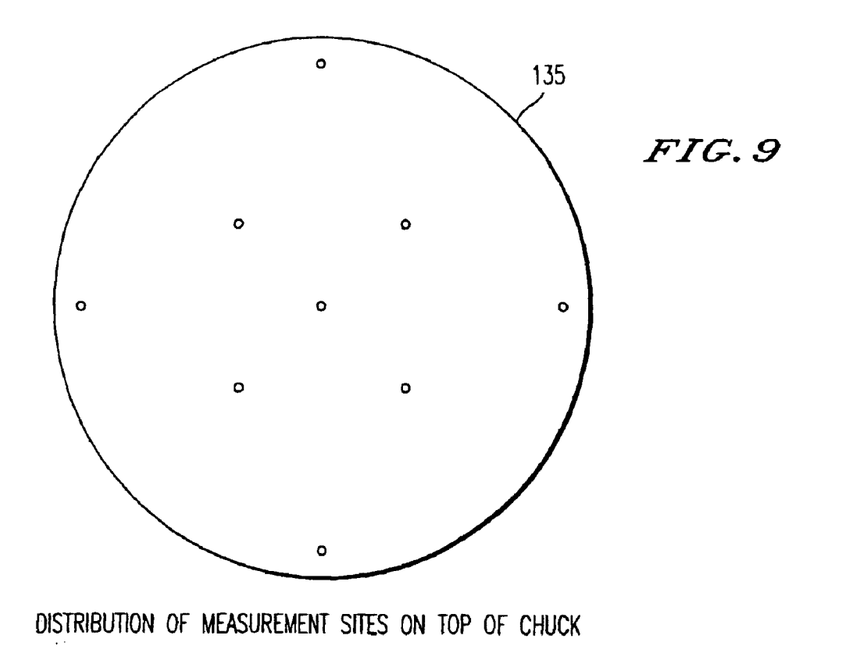
FIG. 9 is a schematic illustration of a wafer including plural measurement sites.

The optical system 195 of FIG. 4 comprises: (a) a band-pass filter 127 that passes (with minimal attenuation) signals at all wavelengths between 0.95 and 1.25 $\mu$m and, as nearly as possible, completely attenuates signals at all wavelengths outside this range; and (b) a neutral density filter or a mechanical iris 200, either of which may be electrically controlled, that permits uniform adjustment of the intensity of those signals at wavelengths between 0.95 and 1.25 $\mu$m transmitted by the band-pass filter 127; and (c) a lens system 110b including multiple elements and having a field of view encompassing the entire substrate; and (d) a 2-D detection array 145 (including either a CCD array or a CID array) on which the IR-transmitting lens system 110b forms an image of the wafer 135, by means of the IR radiation transmitted through the wafer 135 at the multiplicity of measurement sites as illustrated in FIG. 9.

The band-pass filter 127 improves the signal-to-noise ratio (hereinafter "S/N ratio") of the measurement system by reducing to acceptable levels the effect of radiation at wavelengths not between 0.95 and 1.25 $\mu$m, the range of interest herein, on the detection array 145. The neutral density filter or mechanical iris 200 provides a means by which the intensity of the IR radiation, with wavelengths between 0.95 and 1.25 $\mu$m, that impinges on the 2-D detection array 145 can be reduced as required to assure that no element of the 2-D detection array 145 is saturated due to the IR radiation that impinges upon it. In this way, erroneous data due to the saturation of individual elements of the 2-D detection array 145 is prevented.

Figure 1D:
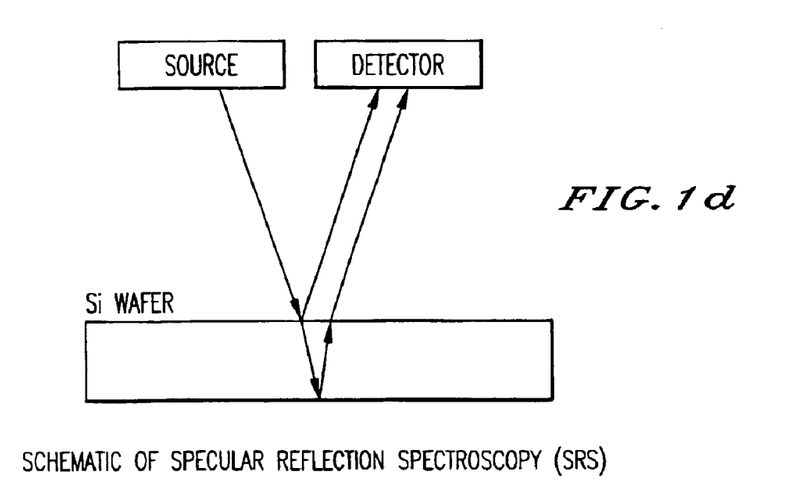
FIG. 1D is a schematic illustration of a first configuration of an apparatus using specular reflection spectroscopy.
Figure 2:
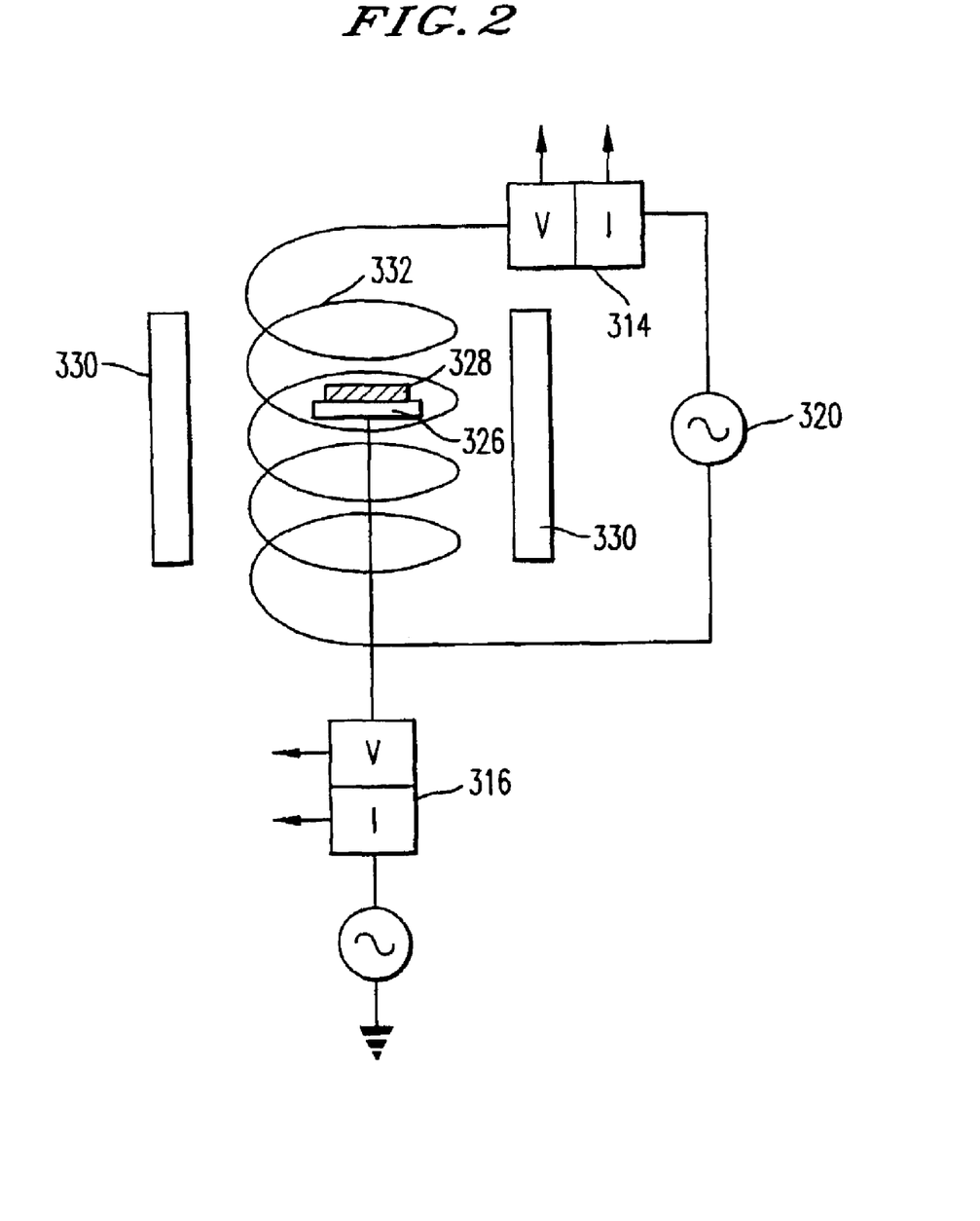
FIG. 2 is an illustration of a prior art inductively coupled plasma (hereinafter ICP) source.
Figure 3:
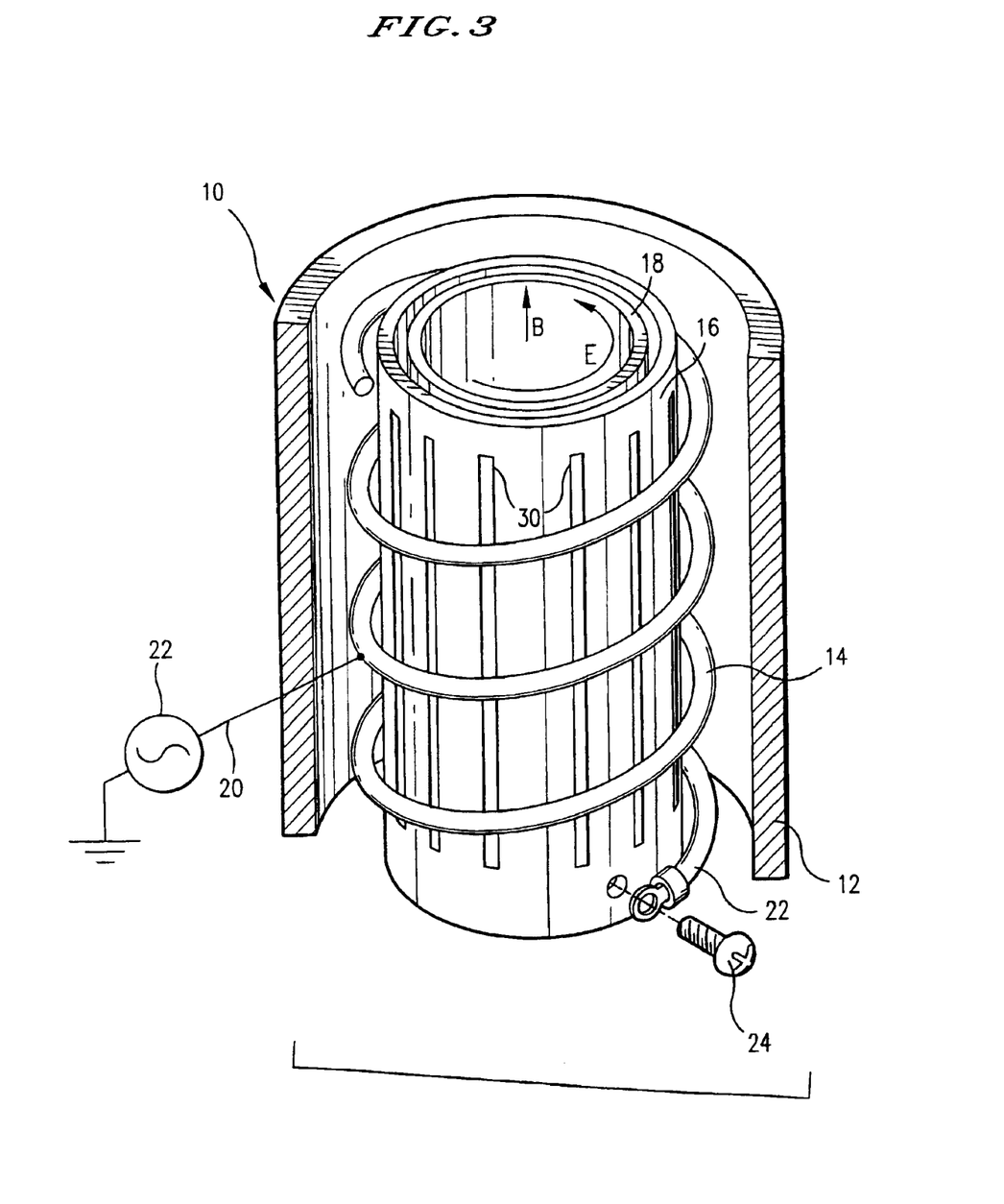
FIG. 3 is an illustration of a prior art electrostatically shielded radio frequency (hereinafter ESRF) plasma source.

The measurement system according to the present invention uses the TS mode arrangement generally shown in FIG 1D. A schematic representation of one embodiment of the present invention is shown in FIG. 4. It includes a broad spectrum light source 100, an acousto-optical tunable filter (hereinafter AOTF) 140, the wavelength sensitive optical system 195 described above, and a lock-in amplifier 150.

A broad spectrum light source 100 (e.g., a tungsten-halogen light source or an array of IR light emitting diodes (hereinafter "LEDs")) emits IR radiation that is focused by lens 110a (either a single-or multi-element lens) onto the entrance aperture of collimator 111. The radiation passing through collimator 111 is periodically chopped (i.e., interrupted) by the mechanical chopper 105 driven by the motor 155. The radiation that passes through the mechanical chopper 105 impinges on the input aperture of the AOTF 140, which is driven by the radio frequency (hereinafter "RF") driver 141. The frequency of the signal from the RF driver 141 determines the narrow band of frequencies that will pass through the AOTF 140, which has the capability to select signals having wavelengths within the range from about 0.95 µm to about 1.25 µm with a response time of approximately 5 µsec. The angle at which the radiation with the selected wavelength leaves the AOTF 140 depends, in general, on the wavelength. However, it is advantageous for all IR radiation that leaves the AOTF 140 to travel in the same direction when it enters reaction chamber 125 through IR-transmitting vacuum window 120a. To achieve this end, the prism 184 is included in the optical path between the AOTF 140 and the IR-transmitting vacuum window 120a.

In one embodiment, the IR radiation passes through IR-transmitting vacuum window 120a and impinges upon optical beam splitter 130, which divides the IR radiation into plural parts (either equal or dissimilar), the number of parts being determined by the number of measurement sites on the wafer 135 at which the temperature is to be determined. In an alternate embodiment, in which only one measurement site is used, the optical beam splitter 130 is omitted. FIG. 4 shows a division into only two equal parts for simplicity, but a division into many (e.g., ≧10) equal parts is possible. The IR-transmitting vacuum window 120a maintains the vacuum integrity of the reaction chamber 125. Some of the IR radiation passes through the wafer 135, through the plasma 196, and impinges on the wavelength sensitive optical system 195.

Figure 5:
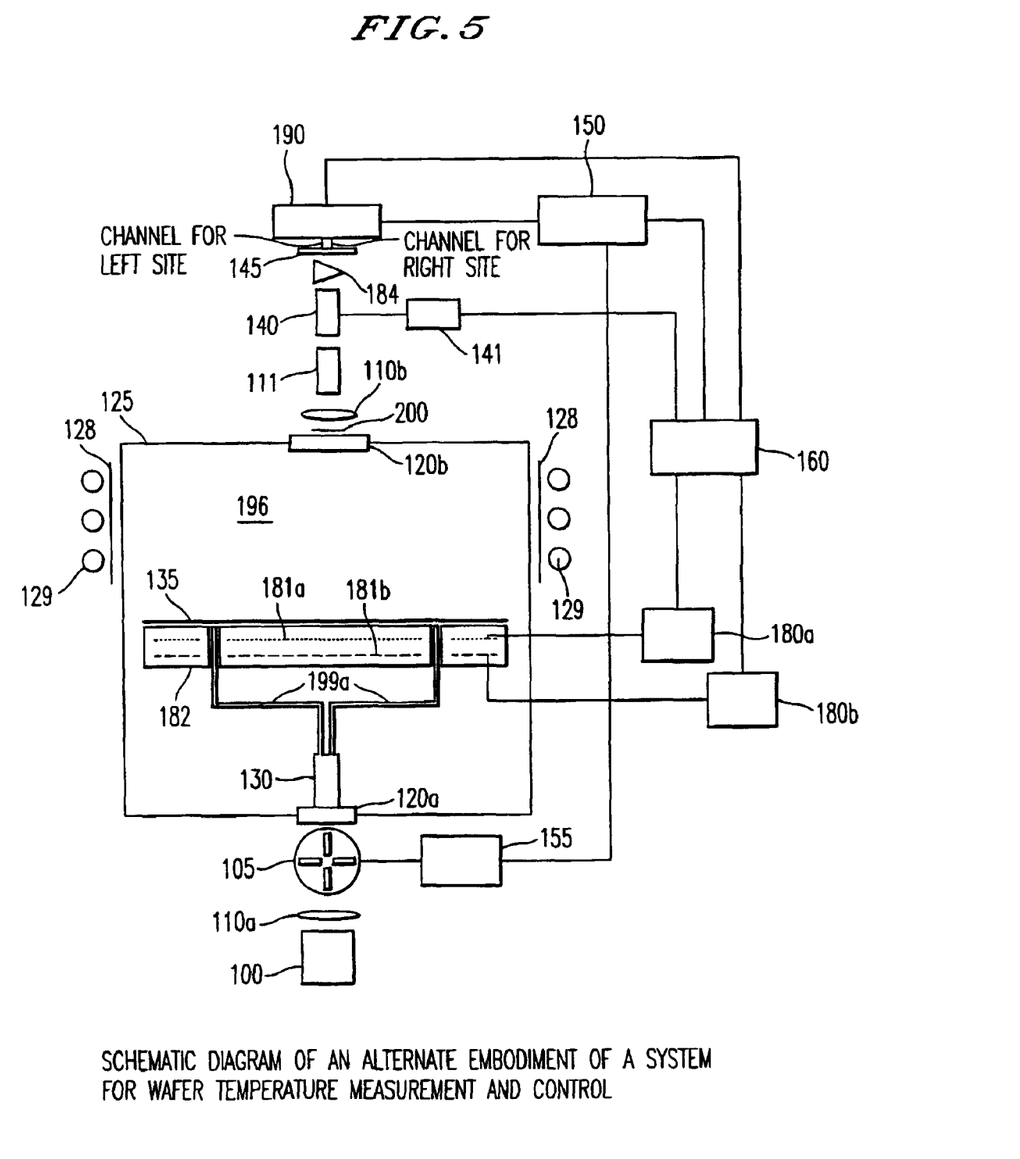
FIG. 5 is a schematic illustration of a second embodiment of a wafer temperature measurement system that uses feedback to control the temperature of a substrate.

An additional embodiment of the invention is shown in FIG. 5. In the embodiment of FIG. 5, the AOTF 140 selects the IR radiation to be analyzed after it has passed through the process chamber 125 (as contrasted to FIG. 4 discussed herein above). The embodiment of FIG. 5 uses the broad spectrum light source 100 described above but does not require a band-pass filter 127, because in the location shown in FIG. 5, the AOTF 140 rejects all wavelengths except those at each frequency selected by the AOTF 140, thereby greatly improving the signal-to-noise ratio.

In an alternate embodiment derived from the embodiment shown in FIG. 5, the radiation emerging from the AOTF is not propagated by the prism 184 in the same direction independent of its wavelength. In yet another alternate embodiment, the prism 184 is omitted altogether. For such embodiments, it is possible to unambiguously associate an element or groups of elements of the 2-D detection array 145 with an individual measurement site on the substrate 135 and an individual wavelength as determined by the AOTF 140 and the RF driver 141, thus, simplifying the design of the interrogator 190.

Figure 6:
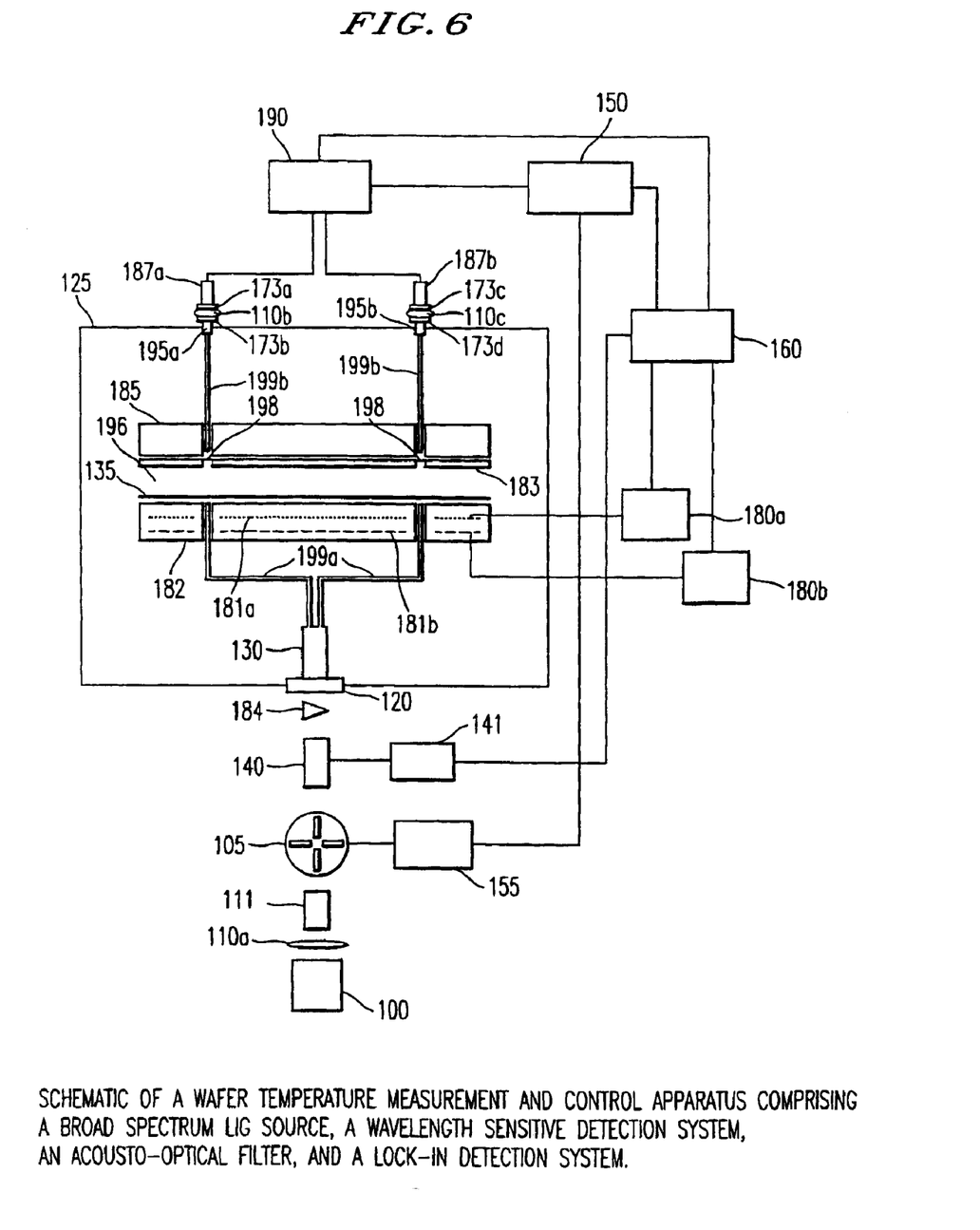
FIG. 6 is a schematic illustration of a third embodiment of a wafer temperature measurement system that uses feedback to control the temperature of a substrate.

In FIG. 6, the IR radiation passes through vacuum window 120 and impinges upon optical beam splitter 130, which divides the IR radiation into at least two parts (e.g., 10 parts, where the number of parts is determined by the number of sites on wafer 135 at which the temperature is to be determined). Vacuum window 120 maintains the vacuum integrity of reaction chamber 125. Optical fibers 199a conduct IR radiation through wafer chuck 182 to the under side of each of the at least two sites on wafer 135 at which the temperature is to be determined. Some of the IR radiation passes through wafer 135, through plasma 196 and through an aperture in drive electrode 185 and silicon electrode 183 and through replaceable windows 198 to optical fibers 199b. Replaceable windows 198 prevent deposits from being formed on the exposed ends of optical fibers 199b.

The IR radiation collected by optical fibers 199b is conducted by them to optical vacuum feedthroughs 195a and 195b, optical filters 173b and 173d, lenses 110b and 110c, and filters 173a and 173c, which focus the IR radiation onto photodiodes 187a and 187b, respectively. In an alternative embodiment, filters 173a and 173c are omitted. In yet another alternate embodiment, filters 173a and 173c are used but filters 173b and 173d are omitted. In a further alternate embodiment, filters 173a, 173b, 173c and 173d are omitted. The amount of radiation coupled to the photodiodes 187a and 187b, thus is controlled to prevent saturation of the detector (or array as described below). The filters pass all wavelengths in a desired range (e.g., between 0.95 mm and 1.25 mm) and as nearly as possible completely attenuate all wavelengths outside the desired range. In an embodiment in which those filters do not prevent saturation of the detectors, a suitable neutral density filter (e.g., an electrically controlled neutral density filter) is included with each band-pass filter. Filters of the types described herein are well known to persons of ordinary skill in the art. In a further alternate embodiment, neutral density filters can be replaced by a mechanical iris for limiting the amount of light passing therethrough.

Optical vacuum feedthroughs 195a and 195b maintain the vacuum integrity of reaction chamber 125. In an embodiment in which focussing lenses are included in the packaged photodiodes, separate lenses 110b and 110c are omitted. The output of each of photodiodes 187a and 187b is selected sequentially by interrogator 190 according to a protocol provided by computer 160 and is conveyed to lock-in amplifier 150. If a lock-in amplifier with a sufficient number of input channels is used, interrogator 190 is not necessary. The output signal from lock-in amplifier 150 is sent to computer 160, which stores the data for each of photodiodes 187a and 187b. After output data for photodiodes 187a and 187b have been stored in computer 160, computer 160 sends a signal to RF driver 141 for acousto-optical filter 140 and the RF drive frequency applied to acousto-optical filter by RF driver 141 is changed to another frequency (e.g., the second of ten pre-selected frequencies). When computer 160 has received data for diodes 187a and 187b corresponding to all pre-selected frequencies, it uses a program stored in its memory to calculate the temperature at the wafer site corresponding to photodiode 187a and at the wafer site corresponding to photodiode 187b. Such temperature measurements can be recorded in volatile or non-volatile storage.

Figure 7:
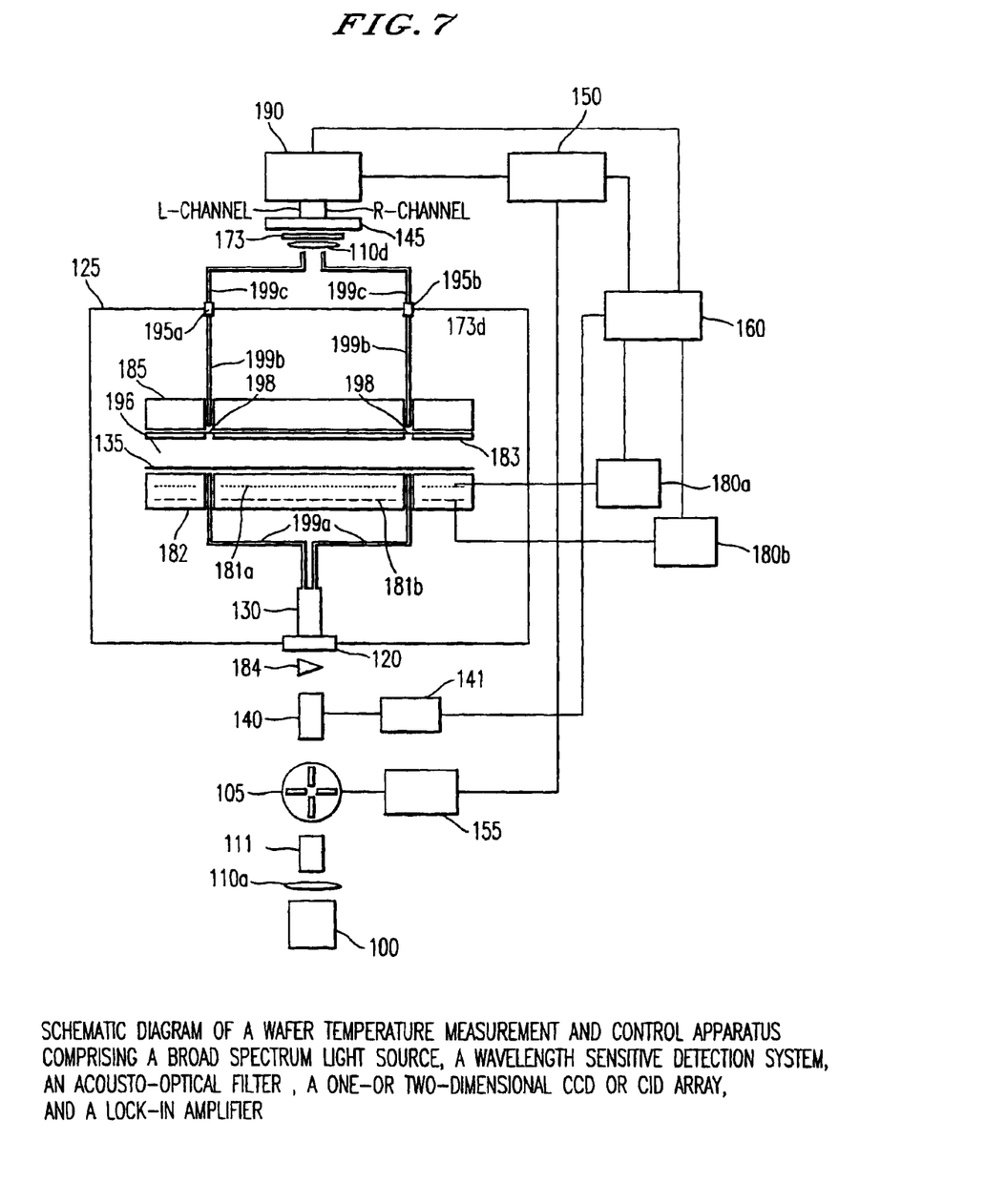
FIG. 7 is a schematic illustration of a fourth embodiment of a wafer temperature measurement system that uses feedback to control the temperature of a substrate.

A fourth embodiment of the feedback system of the present invention is shown in FIG. 7. In this embodiment, optical fibers conduct the IR radiation from optical vacuum feedthroughs 195a and 195b to lens 110d through filter 173 which focuses the radiation on charge-coupled-device (CCD) array or charge-injection-device (CID) array 145 which may be either a linear array or a two-dimensional array. The output of each element of CCD or CID array 145 is selected sequentially by interrogator 190 according to a protocol provided by computer 160 and is conveyed to lock-in amplifier 150. The filter 173 should pass all wavelengths between 0.95 mm and 1.25 mm and as nearly as possible completely attenuate all wavelengths outside this range. If the filter does not prevent saturation of the CCD or CID array, it may be necessary to include with the band-pass filter a suitable neutral density filter. An electrically controlled neutral density filter may be used. Filters of the types described herein are known to persons of ordinary skill in the art. Except as noted here, the fourth embodiment is the same as the third embodiment.

All of the embodiments described herein may also be realized using an AOTF having integral fiber optic input and output pigtails. When an AOTF of this type is used, some modifications of the optical elements proximate to the AOTF 140 shown in FIG. 4 or FIG. 5. For example, in the embodiment shown in FIG. 5, fiber collimators/focusers like the SMA 905 or SMA 906 manufactured by OZ Optics, Ltd.

might be used advantageously with a pigtailed AOTF in conjunction with or in place of collimator 111 and prism 184. Such modifications would be understood by a person of ordinary skill in the art and are, of course, consistent with the spirit of this invention.

The measurement procedure begins when the equipment operator enters a start command by means of the input terminal (e.g., keyboard 422 or mouse 424) of the computer 160. RF driver 141 then sends to AOTF 140 a signal that selects the first narrow band of IR wavelengths for passage through the wafer 135. The output of each element of the 2-D detection array 145 is selected sequentially by the interrogator 190 according to a protocol provided by the computer 160 and is conveyed to the lock-in amplifier 150 and thereafter to the computer 160, which stores the data for each element of the 2-D detector array 145. (If a lock-in amplifier with a sufficient number of input channels is used, the interrogator 190 is not necessary.) After output data for each element of the 2-D detection array 145 have been stored in the computer 160, the computer 160 sends a signal to the RF driver 141 for the AOTF 140 and the RF drive frequency applied to the AOTF 140 by the RF driver 141 is changed to another of, perhaps, ten pre-selected values. The computer 160, having received data for all elements of the 2-D detector array 145 corresponding to all of the pre-selected frequencies, calculates the temperatures at the wafer sites corresponding to the respective elements of the 2-D detection array 145. After calculating the temperature, the computer 160 regulates the temperature distribution. The computer may direct the wafer chuck heater controller 180a to adjust the power delivered to the multi-element substrate heater 181a to cause the substrate temperature to become either more or less uniform. The computer 160 may also direct the wafer chuck cooler controller 180b to adjust the multi-element substrate cooler 181b to cause the substrate temperature to become more or less uniform. To regulate cooling, the multiple element substrate cooler 181b within the wafer chuck includes plural channels through which the flow of a coolant is controlled by the wafer chuck cooler controller 180b. In an alternate embodiment, an array of thermoelectric coolers are embedded in the chuck.

Although the above discussion has assumed a spectral resolution of 30 nm, it is possible to obtain a spectral resolution of 3 nm if the measurement speed (i.e., the interrogation or sampling frequency) is reduced by an order of magnitude. This reduction in measurement speed produces system response times of 20 msec to 1 sec depending upon the light source (and the modulation frequency for lock-in detection). In general, the S/N ratio is greater when using the TS mode rather than the DRS mode (in particular, for silicon wafer temperature measurement). However, in the event that the S/N ratio is low, it can be improved by using the lock-in amplifier 150. The light source is modulated (e.g., using a mechanical chopper which communicates with the computer 160) and the resultant signal is amplified by the lock-in amplifier 150. In this manner, the signal can be extracted from the noise by observing the response occurring at the frequency determined by the chopper 105. However, the speed of the measurement becomes limited by the frequency of the mechanical chopper 105 (coupled to the broadband light source 100) and the subsequent lock-in amplifier 150.

In an alternate embodiment, the broad spectrum light source 100 shown in FIG. 4 includes plural infrared (IR) LEDs, because they are capable of responding to significantly higher modulation frequencies. For that reason, they can greatly improve the measurement speed. Accordingly, any other IR light source compatible with a high modulation frequency and having a broad spectrum output may also be used.

In still another embodiment, light source 100 in FIG. 4 is replaced by an array comprising on the order of ten laser diodes (e.g., $InGa_xP_{1-x}$ laser diodes with different values of the parameter x), each of which emits IR radiation over a very narrow range of wavelengths. The wavelength emitted by the nth laser diode is approximately given by $\lambda(n)=0.95+(0.04)n$ $\mu m$ where n is an integer with a value between 0 and approximately 9, but other relationships between the emitted wavelengths are possible. Consequently, the ten laser diodes provide ten approximately equally separated wavelengths that span the range of wavelengths of interest for this application (approximately 0.95 to 1.25 $\mu m$); so the AOTF 140, RF driver 141, and prism 184 are not necessary. However, RF driver 141 is replaced in this embodiment by a multi-output diode controller that sequentially causes one (and only one) of the approximately ten laser diodes to emit IR radiation.

Lastly, the high speed measurement (update time <100 msec) of substrate temperature at a multiplicity of pre-arranged spatial locations on the substrate enables the chamber thermal characteristics to be optimized at the substrate. Moreover, with this rapid temporal response, it is possible to adjust the spatial distribution of the substrate temperature as the wafer is being processed.

Only a fraction of the light at each wavelength is transmitted through the substrate whereupon it is received by the analyzer (e.g., a spectrometer). The AOTF 140 is capable of rapidly tuning the pass-band wavelength across the pre-selected spectral range (e.g., from approximately 0.95 $\mu m$ to 1.25 $\mu m$). For each wavelength in the scan sequence the transmission light intensity is recorded using the 2-D detection array 145 shown in FIG. 4. The temperature at each measurement site on the substrate 135 is then obtained from the transmission spectrum using any of several known techniques to obtain a pre-determined calibration curve.

As already described, the system uses a broad band light source 100 (e.g., (1) a tungsten-halogen stabilized light source, or (2) an array of IR LEDs, or (3) an array of laser diodes). Due to the physical size of a conventional lamp filament, the coupling efficiency of the light into the AOTF 140 is low. Furthermore, if there are n measurement sites, only 1/n of the light intercepted by the AOTF 140 is coupled to the optical fibers 199a for each measurement site. Therefore, the lock-in amplifier 150 is generally required. When using a tungsten-halogen stabilized lamp, the light source is modulated at 1 to 2 kHz using the mechanical chopper 105. Lock-in detection is used to remove the incoherent signal (i.e., noise) due to any ambient background light that may impinge on the 2-D detection array 145 shown in FIG. 4. An advantage to using the tungsten-halogen stabilized light source is its relatively low cost, and its ability to provide a continuous spectrum across the spectral range of interest, (e.g., 0.95 $\mu m$ to 1.25 $\mu m$). However, as stated, the tungsten-halogen lamp is less efficient in coupling light to the optical fibers 190a than some other sources (e.g., laser diodes).

An important part of a lock-in amplifier is a low-pass filter, which may be characterized either by its upper half-power frequency (i.e., −3 dB frequency) or its time constant. The time constant is $\frac{1}{2\pi f_c}$, where $f_c$ is the −3 dB or cutoff frequency of the filter. Traditionally, the low-pass filters of lock-in amplifiers have been characterized by their time constant. (The concept of a time-constant is relevant here, because the output of the lock-in amplifier will be relatively time-independent.) The time-constant reflects how slowly the output responds to a change in the input, and, consequently, the degree of smoothing. A greater time-constant causes the output signal to be less affected by spurious causes and, therefore, to be more reliable. Hence, a trade-off must be considered because real changes in the input signal take many time constants to be reflected at the output. This is because a single-section RC filter requires about 5 time constants to settle to its final value. It is obvious that faster measurements require shorter time-constants and, therefore higher cutoff frequencies for the filters. Therefore, the conventional chopper at a chopping frequency of approximately 1 kHz provides a response time of approximately 5 msec for each wavelength increment at each measurement site. Hence, such a mechanical chopper-based design is a suitable for measurement of the substrate temperature every 50 msec for each selected band of IR wavelengths. (This result assumes measurements at ten sites and that the data extraction algorithm requires approximately 0.01 msec per measurement.). Therefore, for ten measurement sites and ten wavelength increments, approximately 500 msec is required for a complete scan of the substrate. An alternate embodiment obtains the data for all measurement sites and all wavelength increments according to other protocols.

Due to limitations imposed by the mechanical chopper 105, the modulation frequency is constrained to values much lower than those attainable with LEDs. LEDs, operating in the range of wavelengths between 0.95 $\mu$m and 1.25 $\mu$m, typically have a spectral bandwidth of 10 to 30 nm. Therefore, approximately 9 to 10 LEDs will be necessary to span the wavelengths of interest. For improved S/N ratio, lock-in detection can be used wherein LEDs may be modulated at up to 200 MHz (a significant improvement over the combination of the mechanical chopper 105 and the tungsten-halogen broad band light source). Hence, the LEDs can solve many of the issues related to speed and light coupling. Although LEDs have considerably less total optical power than a typical tungsten-halogen light source, their power output in the portion of the spectrum of interest here is comparable. One additional advantage to using LEDs is that a separate LED per optical port (or channel) may be used to improve the S/N ratio. A disadvantage of using LEDs is their potentially reduced stability and cost. Either way, the background light source spectrum will be recorded as the reference spectrum at each measurement interval and each measurement site.

Use of a modulation frequency of approximately 100 kHz can provide a response time for each measurement on the order of 0.05 msec, which corresponds to about 0.06 msec per measurement when the data acquisition time is included. Hence, it is possible to obtain a total measurement response time of approximately 6 msec for ten wavelength increments and ten measurement sites.

Method for Extracting Temperature Information

An important part of any technology relating to band-gap thermometry is the method of extracting temperature from the spectra. The present invention utilizes a digital filter that is based upon a higher-order derivative of the spectrum. Other means of extraction (e.g., a method based on wavelet transforms) may be possible. The primary advantage of the digital filter is its speed. This is important for achieving the 10 to 100 msec update times for fine-grain control. Current band-edge thermometry technology updates temperature on the order of once per second, in which case the computational speed of current personal computers is not an issue. The present invention, however, increases the measurement frequency by at least a factor of ten, without approaching the computational limits of those computers.

By providing accurate measurements, the system can use the substrate's temperature as a feedback in a control loop. Thus, the present invention provides a method to control the temperature distribution on a substrate during processing. In conjunction with the system described in the co-pending patent application entitled "Multi-zone resistance heater, U.S. Ser. No. 60/156,595" the contents of which are incorporated herein by reference, the multi-site temperature measurement system can provide an improved feedback control of substrate temperature. In that combination, the control signal is used to adjust the heating and/or cooling of individual zones (or sectors) pre-designed within the chuck (or substrate holder). Due to the speed of the measurement system (<100 msec) relative to the thermal response to heating/cooling adjustments (~1–2 seconds), information obtained from successive temperature measurements (e.g., rate of change or first derivative of the temperature with respect to time) can provide information to the design of a robust control algorithm.

Figure 10:
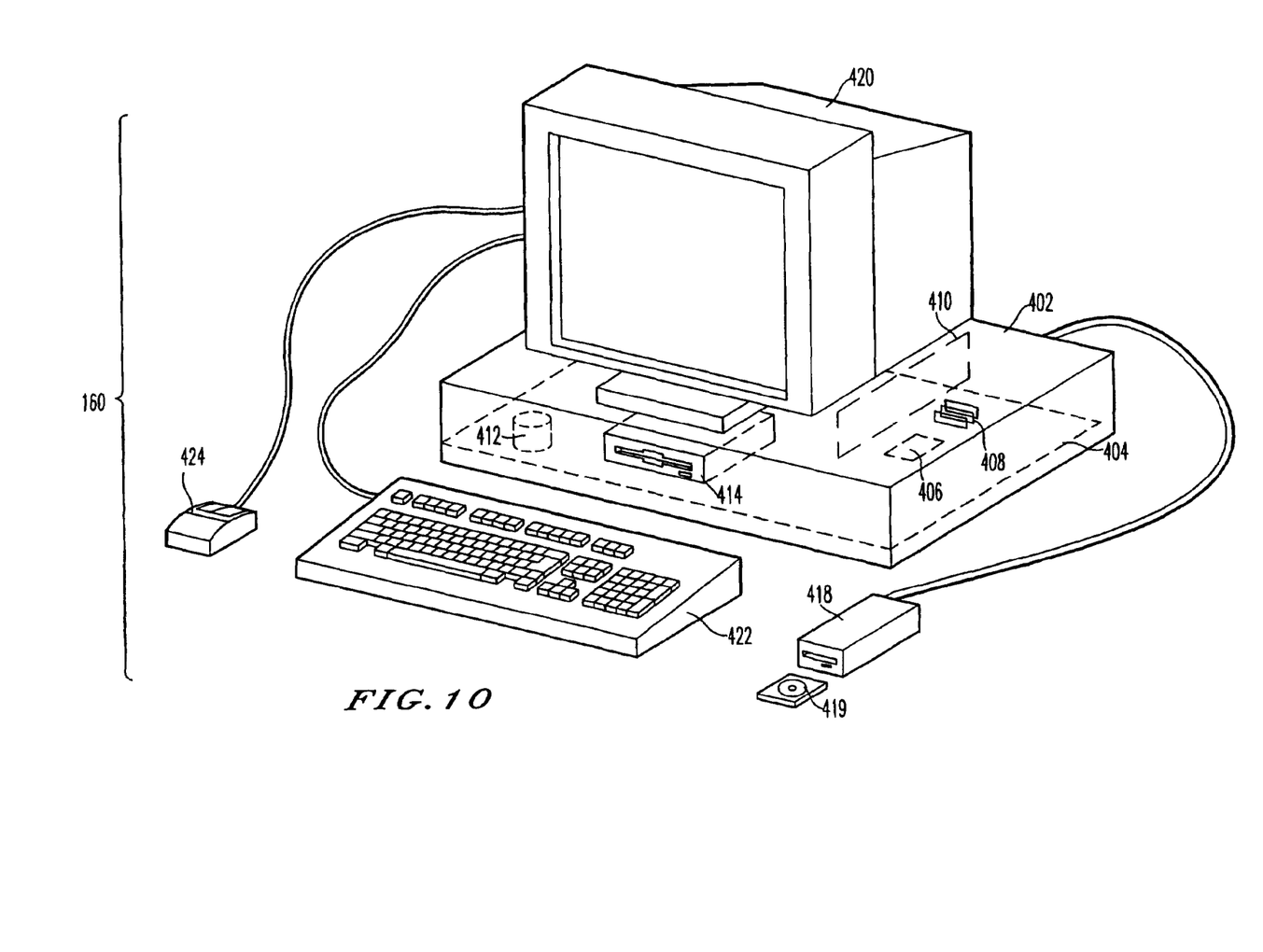
FIG. 10 is a schematic illustration of a computer.

A computer system 160 shown in FIG. 10 monitors the temperature and signals any combination of heating and/or cooling zones to increase or decrease the current heat flux. In particular, the power to each heating or cooling element and/or the coolant flow rate can be adjusted to provide for the designated heat flux either into or out of an individual zone. The computer 160 of FIG. 10 implements the method of the present invention, wherein the computer housing 402 houses a motherboard 404 which contains a CPU 406, memory 408 (e.g., DRAM, ROM, EPROM, EEPROM, SRAM, SDRAM, and Flash RAM), and other optional special purpose logic devices (e.g., ASICs) or configurable logic devices (e.g., GAL and re-programmable FPGA). The computer 160 also includes plural input devices, (e.g., a keyboard 422 and mouse 424), and a display card 410 for controlling monitor 420. In addition, the computer system 160 further includes a floppy disk drive 414; other removable media devices (e.g., compact disc 419, tape, and removable magneto-optical media (not shown)); and a hard disk 412, or other fixed, high density media drives, connected using an appropriate device bus (e.g., a SCSI bus, an Enhanced IDE bus, or a Ultra DMA bus). Also connected to the same device bus or another device bus, the computer 160 may additionally include a compact disc reader 418, a compact disc reader/writer unit (not shown) or a compact disc jukebox (not shown). Although compact disc 419 is shown in a CD caddy, the compact disc 419 can be inserted directly into CD-ROM drives which do not require caddies. In addition, a printer (not shown) also provides printed listings of the temperature of the substrate, in one or more dimensions over time.

As stated above, the system includes at least one computer readable medium. Examples of computer readable media are compact discs 419, hard disks 412, floppy disks, tape, magneto-optical disks, PROMs (EPROM, EEPROM, Flash EPROM), DRAM, SRAM, SDRAM, etc. Stored on any one or on a combination of computer readable media, the present invention includes software for controlling both the hardware of the computer 160 and for enabling the computer 160 to interact with a human user. Such software may include, but is not limited to, device drivers, operating systems and user applications, such as development tools. Such computer readable media further include the computer program product of the present invention for measuring the temperature of a substrate. The computer code devices of the present invention can be any interpreted or executable code mechanism, including but not limited to scripts, interpreters, dynamic link libraries, Java classes, and complete executable programs.

Obviously, numerous modifications and variations of the present invention are possible in light of the above teachings. It is therefore to be understood that, within the scope of the appended claims, the invention may be practiced otherwise than as specifically described herein.

What is claimed is:

1. An apparatus for measuring temperatures of plural physically separated locations on a substrate in a plasma processing system, comprising:

a substrate holder for holding a substrate to be processed in the plasma processing system;

a broad band light source on a first side of the substrate holder for coupling light to the substrate to be processed said broad band light source emitting at least a range of wavelengths for which light transmission through the substrate changes from essentially no transmission to essentially a maximum transmission; and plural physically separated light collectors on a second side of the substrate holder, opposite the first side, for collecting a portion of light transmitted through the substrate held by the substrate holder.

2. The apparatus as claimed in claim 1, wherein the light source comprises a modulated light source.

3. The apparatus as claimed in the claim 2, wherein the modulated light source comprises an electrically modulated light source.

4. The apparatus as claimed in the claim 2, wherein the modulated light source comprises a mechanically modulated light source.

5. The apparatus as claimed in claim 4, wherein the mechanically modulated light source comprises:

a broadband light source; and a mechanical chopper.

6. The apparatus as claimed in claim 3, wherein the electrically modulated light source comprises an electrically modulated broadband light source.

7. The apparatus as claimed in claim 3, wherein the electrically modulated light source comprises plural LEDs.

8. The apparatus as claimed in claim 3, wherein the electrically modulated light source comprises plural lasers.

9. The apparatus as claimed in claim 1, further comprising an acousto-optic tunable filter interposed between the light source and the substrate holder.

10. The apparatus as claimed in claim 1, further comprising an acousto-optic tunable filter interposed between the substrate holder and the plural light collectors.

11. The apparatus as claimed in claim 1, wherein the plural light collectors comprise plural photodiodes.

12. The apparatus as claimed in claim 1, wherein the plural light collectors comprise a charge-coupled device array.

13. The apparatus as claimed in claim 1, wherein the plural light collectors comprise a charge-injection device array.

14. The apparatus as claimed in claim 1, further comprising an error detection circuit for detecting a temperature difference between (1) a measured temperature of a portion of the substrate corresponding to a location of one of the plural physically separated light collectors and (2) a target temperature for the portion of the substrate corresponding to the location of the one of the plural physically separated light collectors.

15. The apparatus as claimed in claim 14, wherein the substrate holder comprises at least one of a heating element and a cooling element for changing a temperature of the portion of the substrate corresponding to the location of the one of the plural physically separated light collectors based on an output of the error detection circuit.

16. The apparatus as claimed in claim 14, wherein the substrate holder comprises at least one of a heating element and a cooling element for changing a temperature of a portion of the substrate not corresponding to the location of the one of the plural physically separated light collectors based on an output of the error detection circuit.

17. The apparatus as claimed in claim 1, wherein the light collection system comprises a central light detector.

18. The apparatus as claimed in claim 1, wherein the light collection system comprises plural, physically separated light collectors.

19. The apparatus as claimed in claim 1, wherein the plasma processing system is an inductively coupled plasma processing system.

20. The apparatus as claimed in claim 1, wherein the plasma processing system is a capacitively coupled plasma processing system.

* * * * *